(12) United States Patent
Pezzini

(10) Patent No.: US 6,873,272 B2
(45) Date of Patent: Mar. 29, 2005

(54) INTEGRATED ANALOG-TO-DIGITAL CONVERTER WITH DETECTION OF EXTERNAL FAULTS

(75) Inventor: Saverio Pezzini, Vimercate (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 10/713,541

(22) Filed: Nov. 14, 2003

(65) Prior Publication Data

US 2004/0125007 A1 Jul. 1, 2004

(30) Foreign Application Priority Data

Nov. 14, 2002 (IT) ........................................ VA02A0057

(51) Int. Cl.[7] .............................................. H03M 1/10
(52) U.S. Cl. ........................ 341/120; 341/155; 341/164
(58) Field of Search ................................ 341/120, 155, 341/156, 164, 165, 158, 118, 126

(56) References Cited

U.S. PATENT DOCUMENTS

| | | | | |
|---|---|---|---|---|
| 4,081,800 A | * | 3/1978 | Amemiya et al. | .......... 341/129 |
| 5,886,640 A | * | 3/1999 | Wang et al. | ................. 340/635 |
| 6,486,806 B1 | * | 11/2002 | Munoz et al. | .............. 341/120 |
| 6,701,262 B2 | * | 3/2004 | Mizuno et al. | ................ 702/60 |

* cited by examiner

Primary Examiner—Brian Young
Assistant Examiner—John B Nguyen
(74) Attorney, Agent, or Firm—Allen, Dyer, Doppelt Milbrath & Gilchrist, P.A.; Lisa K. Jorgenson

(57) ABSTRACT

An integrated circuit includes an input pad for receiving an externally generated analog signal, and a pre-sampling circuit for pre-sampling at least one internally generated analog reference signal. An analog-to-digital converter is connected to the input pad for providing a numerical value of the externally generated analog signal, and is connected to the pre-sampling circuit for providing a numerical value of the internally generated analog reference signal. A fault signaling circuit is connected to the pre-sampling circuit and to the analog-to-digital converter for generating a fault signal when the numerical value of the externally generated analog signal is equal to the numerical value of the internally generated analog reference signal. The fault signal indicates that an electrical connection providing the externally generated analog signal to the input pad is faulty.

25 Claims, 3 Drawing Sheets

INTEGRATED ANALOG-TO-DIGITAL CONVERTER WITH DETECTION OF EXTERNAL FAULTS

FIELD OF THE INVENTION

The present invention relates to analog-to-digital converters, and in particular, to an integrated microcontroller control system comprising an analog-to-digital converter for measuring analog electrical variables by applying an analog signal representing an electrical variable to be measured at an analog input pin of the integrated microcontroller control system.

BACKGROUND OF THE INVENTION

In many areas of application for microcontroller control systems, where it is important to ensure reliability of control routines being executed, the control system should be able to automatically detect malfunctions or faults in circuits and electrical connections that may occur. For instance, malfunctions or faults in the connections to the printed circuit board or in the bond wire connection to the pads of the integrated circuit should be detected.

In the automotive field for instance, short-circuits and/or disconnections as a result of jolts and other accidental stresses are relatively frequent. One or more input channels of the analog-to-digital converter that are integrated on the microcontroller chip of the control system of the engine and of other functional devices and subsystems of the vehicle may inadvertently be short-circuited or disconnected. This would cause undesired effects and/or spurious reactions of the control system since they would be without the correct information concerning an important functioning parameter.

To make known any failures such as the above mentioned ones, one technique is to (on the printed circuit board or integrated on the same microcontroller chip containing also the analog-to-digital converter) connect resistors from the input node of the converter to a node at a certain reference potential to force a well defined value on the input of the converter. For instance, the reference potential may be the supply voltage and/or to the virtual ground node of the circuit for instance. This allows detection of anomalous situations, such as an open circuit.

However, the introduction of these resistors may determine set time constants having such a value that they will influence a correct functioning of the converter, or at least noticeably lengthen the sampling time and thus the total conversion time. As a result, in the successive approximations analog-to-digital converter, such as those commonly used in these integrated systems, the conversion time may become excessively long and thus noticeably hinder the performance of the control system.

SUMMARY OF THE INVENTION

In view of the foregoing background, an object of the present invention is to provide a successive approximations analog-to-digital converter that detects external faults while not effecting the performance and reliability of the conversion from analog-to-digital or the acquisition speed of the functioning parameter values for faster processing and automatic control of the functioning conditions of the controlled items.

This and other objects, advantages and features in accordance with the present invention are provided by a self-diagnostic circuit device that implements a pre-sampling conversion of a certain internal voltage of the integrated converter circuit having a known analog reference value, and the storing of its converted numerical value which is thus compared. The device checks whether it is equal or not to the numerical value of the analog voltage present on the analog input pad of the integrated circuit during the successive operating phase of the converter.

By choosing as the reference voltage to be pre-sampled and converted an analog voltage that is normally different from the voltage values that the input pad is expected to assume, and if the numerical value of the sampled analog voltage on the input pad is equal to the pre-sampled numerical reference value, then it is permissible to assume that a certain failure condition is present. For instance, a failure may be a disconnection of the analog input pad (very unlikely the voltage of the pad would float to exactly the mid point of the input range of voltage swing) or a short-circuit (towards ground or the supply voltage) of the scanned input. Consequently, the control logic circuitry of the converter may generate a fault signal on the scanned input channel.

According to a more flexible and preferred embodiment of the present invention, a certain pre-sampled numerical reference value may be stored so that it may be repeatedly compared by a dedicated comparator with numerical sample values of the analog input. This is done to generate identity signals that may be used for revealing possible faults. Preferably, the comparator may use two thresholds for discriminating the following conditions: converted value smaller than a first threshold Vmin, or larger than a second threshold VMAX, or larger than the first threshold Vmin and smaller than the second threshold VMAX. A counter may also be provided for counting how many successive samples of the input signal are identical to the pre-sampled and stored numerical reference value before generating a fault signal.

When the pre-sampled reference value is in the expected range of the converted values of an external analog input signal and the comparator signals a possible fault, the control portion of the A/D or the software may change the pre-sampled value of reference to a much different value. Given that normally the band of the input signal is limited, there will not be an abrupt change of the analog input voltage to be converted and if a tracking of the modified pre-sampled reference value occurs, a fault signal may be reliably generated.

A certain known analog reference value of the integrated circuit of the converter may be pre-sampled and converted by the logic control circuitry of the successive approximations analog-to-digital converter by controlling, for instance, a pair of path selection switches driven in phase opposition for coupling for a pre-established time interval the input node of the converter to a known internal analog voltage reference before coupling the analog input pad of the integrated circuit to be scanned to the input node of the converter by disabling the pre-sampling path. The analog voltage reference may be, for example, equal to the supply node of the circuit or to a ground node or to an intermediate voltage value.

The control circuitry of the converter may even select a known internal analog voltage reference. This may be done by controlling a switch towards the supply node and a switch towards ground relative to a biasing line that may be coupled to the input of the converter during the pre-sampling phase, for example.

According to a preferred embodiment, the pre-sampled numerical value may be stored in a dedicated latch for being compared by a comparator with the sampled numerical values of an analog input signal present on a certain analog input pad of the integrated circuit. This is eventually coupled to the input of the analog-to-digital converter. Obviously, the integrated circuit may have a plurality of analog input pads that may be scanned one at the time for letting the integrated control system store the current values of a plurality of functioning parameters of the controlled devices.

The control circuitry of the converter may also select the output path of the converter during the pre-sampling phase and the successive conversion phase of the analog input value. This may be done, for instance, through another pair of switches driven in phase opposition to each other and in phase with the corresponding switches of the input paths.

DETAILED DESCRIPTION OF THE PREFERRED EMBODIMENTS

Figure 1:
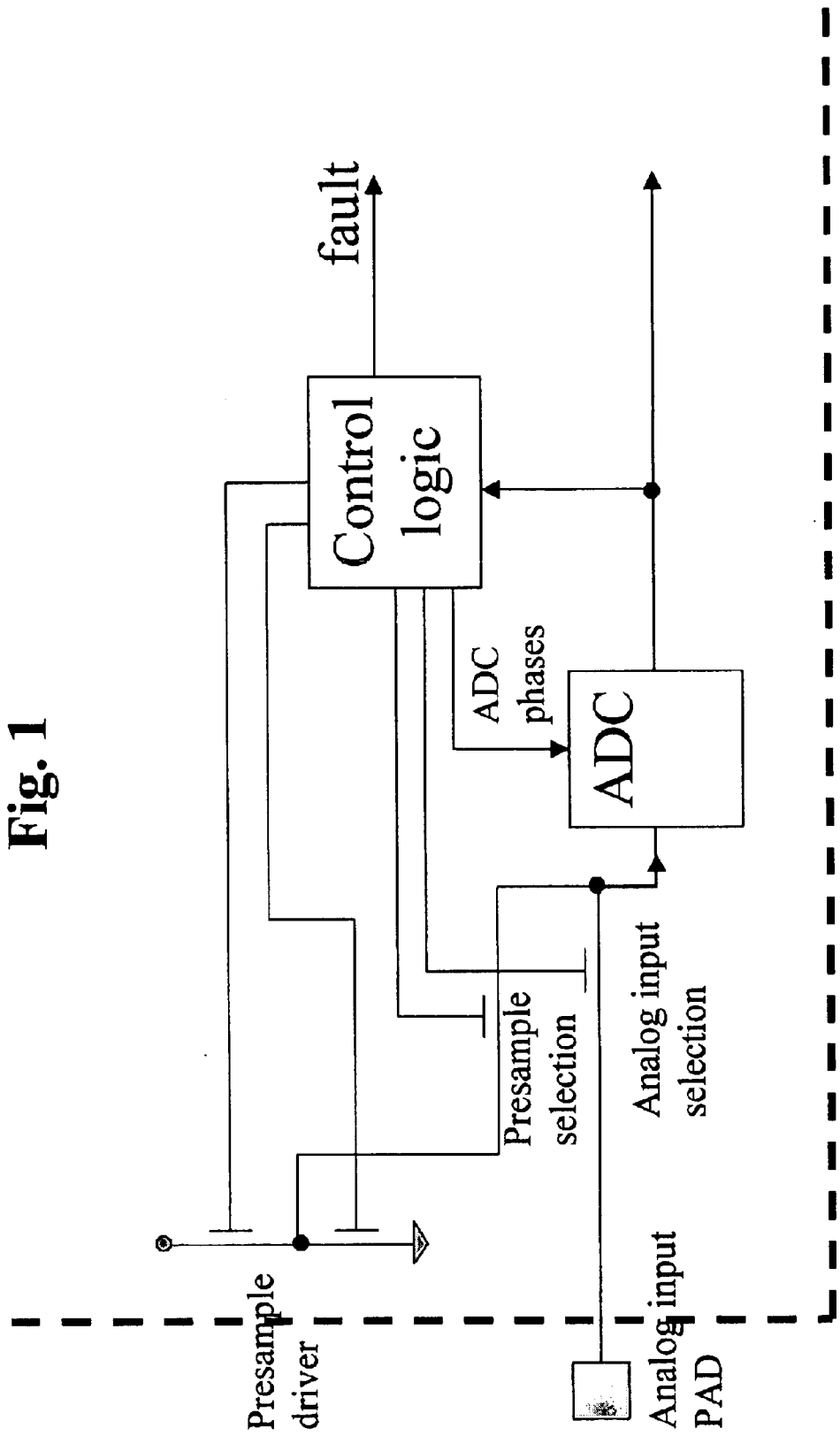
FIG. 1 is a block diagram of a circuit according to a first embodiment of the present invention.

Referring to FIG. 1, a successive approximations analog-to-digital converter is represented schematically by the converting block ADC. The converting block ADC is controlled by the logic control circuitry block CONTROL LOGIC that generates the switching phases ADC PHASES.

A certain analog input pad ANALOG INPUT PAD is to be connected to the input of the converter. Obviously, the integrated device containing the successive approximations analog-to-digital converter may have a certain number of analog input pads to be connected to a corresponding number of sources providing external analog signals. In this case the integrated circuit may include a dedicated multiplexer for selecting one at a time the analog input to be scanned. As an alternative, the inputs may be multiplexed from external the integrated circuit, in which case a single analog input pad is dedicated to receive external analog input signals to be converted to respective numerical values.

According to a basic embodiment of the present invention, the input signal paths of the converter block ADC are selected by a pair of path selection switches driven in phase opposition. These switches are controlled by the logic circuitry CONTROL LOGIC of the converter to define the timing of a pre-sampling phase PRE-SAMPLE SELECTION before an operating phase ANALOG INPUT SELECTION.

During the pre-sampling phase, a known internal analog reference voltage of the integrated circuit is input to the ADC converter. This voltage is converted to a numerical value by the converter that is stored as a numerical reference value within the block CONTROL LOGIC.

During the following operating phase ANALOG INPUT SELECTION, the analog voltage signal on the input pad is converted to a numerical value by the successive approximation comparator ADC. If the numerical value coincides with the stored numerical reference value, the control logic will generate a fault signal FAULT.

If it is required to determine whether the particular analog input pad is accidentally short-circuited to ground or to the supply voltage, the logic control circuitry verifies whether its converted numerical value is identical with the numerical value corresponding to the ground voltage (00h) and is identical with the converted numerical value of the supply voltage (FFh) as recorded during the pre-sampling phase for eventually generating a fault signal.

As schematically shown in FIG. 1, during the pre-sampling phase, the comparator input may be coupled to an internal known voltage reference by a biasing stage. The output node of the biasing stage may be switched to ground or to the supply voltage by two transistor switches driven in phase opposition by the control logic. This updates the end scale value and the mid scale value of the converter.

Figure 2:
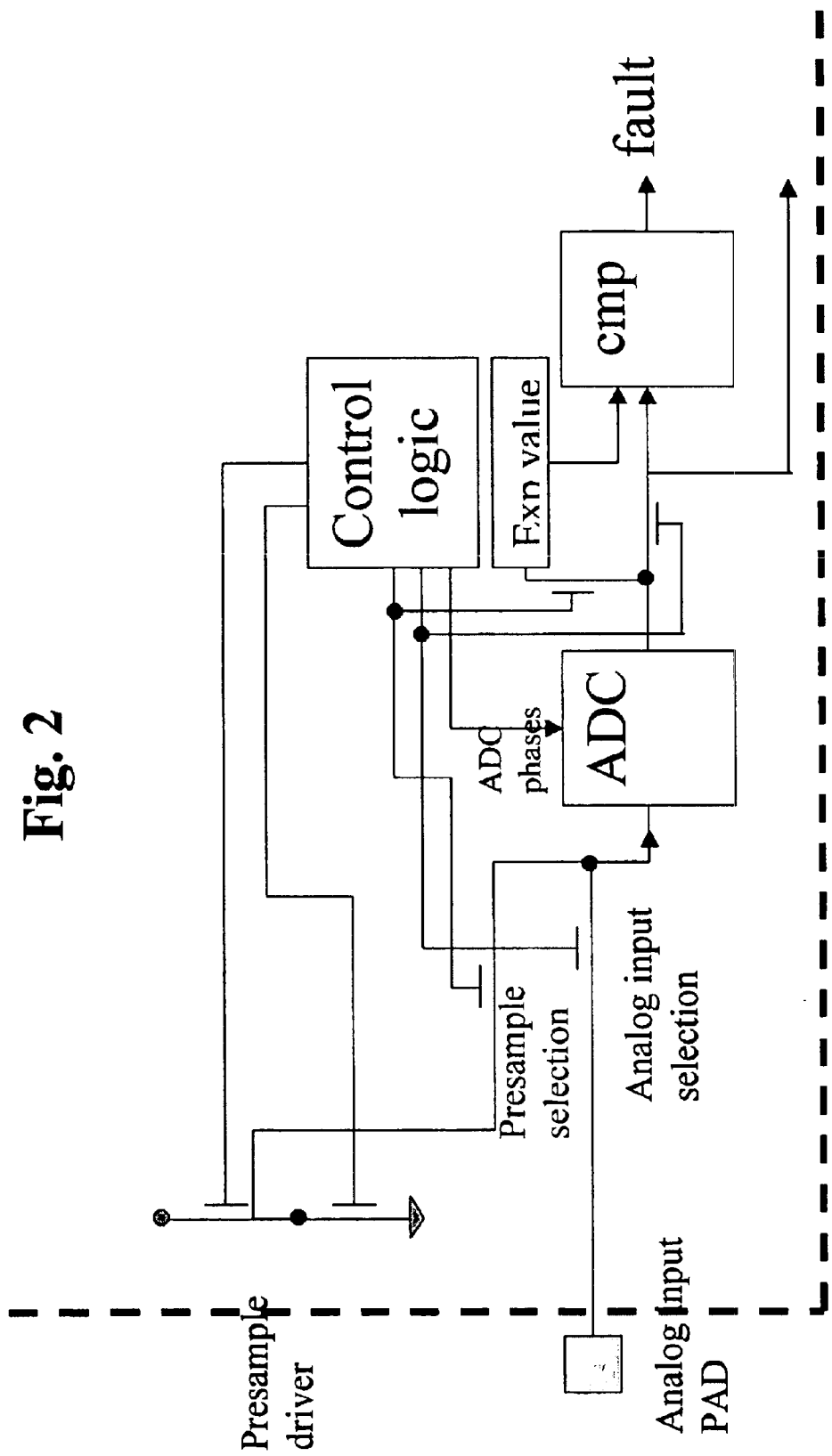
FIG. 2 is a block diagram of an alternative embodiment of the present invention comprising a storage latch for storing the pre-sampled numerical reference data and a comparator for signaling a fault.

FIG. 2 depicts an alternative embodiment based on the use of a comparator CMP and a register EXP VALUE in which numerical reference values measured and converted during a pre-sampling phase are stored. The selection of the output paths toward the register or towards the comparator is performed similarly to the selection of the input paths by a second pair of transistor switches controlled in phase opposition. The comparator CMP outputs a fault signal each time it verifies that the sampled numerical value of the converted analog voltage present on the analog input pad of the integrated circuit is identical with the numerical value present in the register EXP VALUE.

Figure 3:
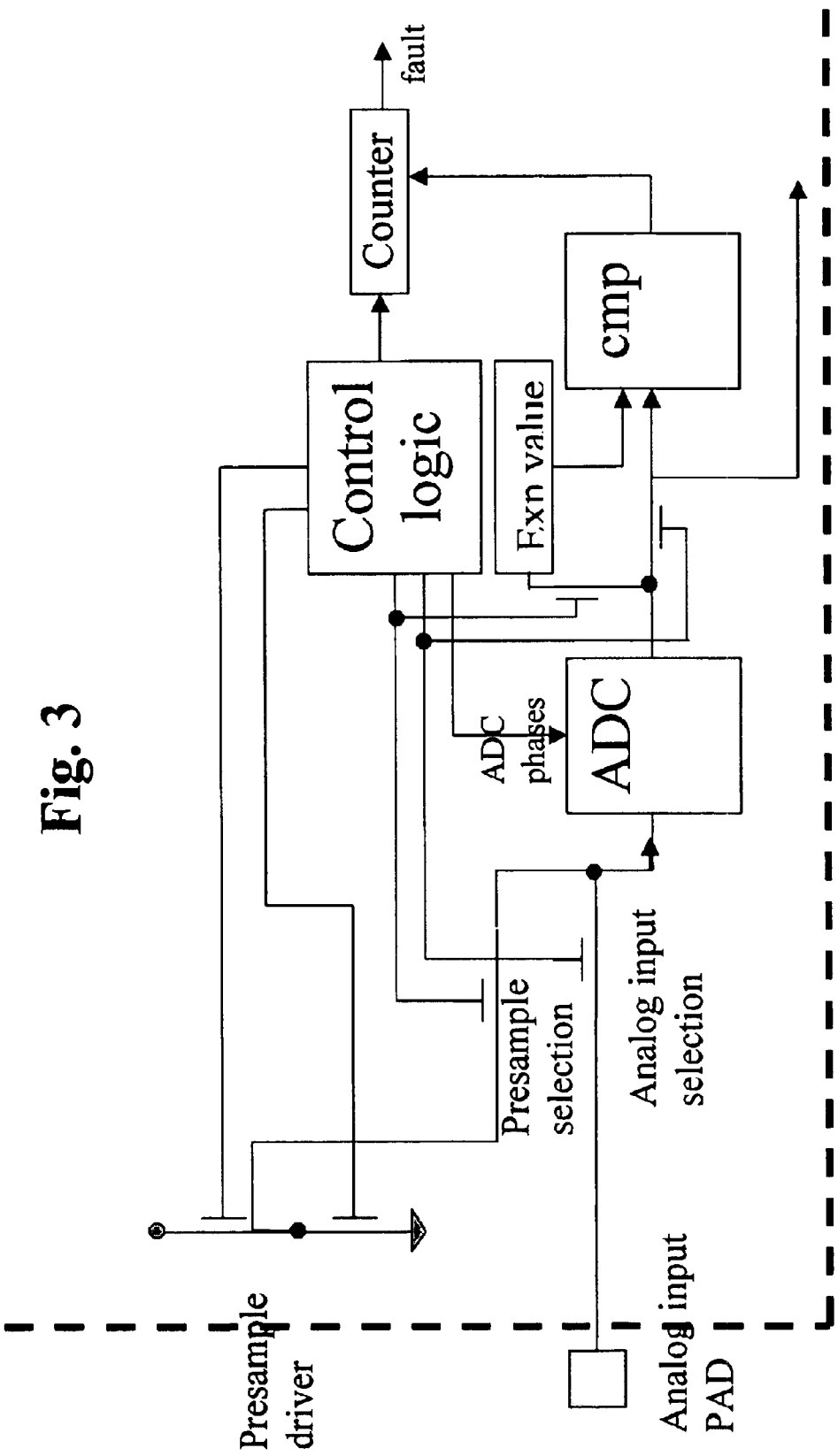
FIG. 3 is a block diagram of another embodiment of the present invention comprising a counter for counting the number of times successive samples of the input signal are to equal the numerical pre-sampled value before a fault signal is produced.

The alternative embodiment shown in FIG. 3 uses a counter COUNTER being fed with the output value of the comparator CMP. The counter COUNTER counts the number of times the conditions significant for a probable fault must be consecutively verified before signaling a fault.

That which is claimed is:

1. An integrated circuit comprising:
   at least one input pad for receiving an externally generated analog signal;
   pre-sampling means for pre-sampling at least one internally generated analog reference signal;
   an analog-to-digital converter connected to said at least one input pad for providing a numerical value of the externally generated analog signal, and connected to said pre-sampling means for providing a numerical value of the internally generated analog reference signal; and
   fault signaling means connected to said pre-sampling means and to said analog-to-digital converter for generating a fault signal when the numerical value of the externally generated analog signal is equal to the numerical value of the internally generated analog reference signal, the fault signal indicating that an electrical connection providing the externally generated analog signal to said at least one input pad is faulty.

2. An integrated circuit according to claim 1, wherein said analog-to-digital converter comprises a successive approximations analog-to-digital converter.

3. An integrated circuit according to claim 1, wherein said pre-sampling means comprises:
   a biasing stage for providing the at least one internally generated analog reference signal; and
   a pair of input path selection switches coupling the input of said analog-to-digital converter either to an output of said biasing stage during a pre-sampling phase of said analog-to-digital converter or to said at least one input pad during a successive operating phase of said analog-to-digital converter;
   said fault signaling means comprising logic control circuitry for driving said pair of input path selection switches.

4. An integrated circuit according to claim 3, wherein said fault signaling means further comprises:
a register for storing the numerical value of the internally generated analog reference signal;
a comparator having a first input connected to said register for receiving the numerical value of the internally generated analog reference signal, and a second input connected to said analog-to-digital converter for receiving the numerical value of the externally generated analog signal; and
a pair of output path selection switches coupling an output of said analog-to-digital converter either to an input of said register during the pre-sampling phase of said analog-to-digital converter or to the second input of said comparator during the successive operating phase of the analog-to-digital converter;
said logic control circuitry for driving said pair of output path selection switches.

5. An integrated circuit according to claim 4, wherein an output of said comparator provides the fault signal.

6. An integrated circuit according to claim 4, wherein said logic control circuitry drives said pair of input path selection switches in an opposing phase, and drives said pair of output path selection switches in an opposing phase.

7. An integrated circuit according to claim 4, wherein said comparator defines a range of values between two thresholds for comparing with the numerical value of the externally generated analog signal.

8. An integrated circuit according to claim 4, wherein fault signaling means further comprises a counter coupled to an output of said comparator for providing the fault signal when said comparator verifies that the numerical value of the externally generated analog signal is equal to the numerical value of the internally generated analog reference signal for a certain number of successive samples of the externally generated analog input signal.

9. An integrated circuit comprising:
at least one input pad for receiving an externally generated analog signal;
a pre-sampling circuit for pre-sampling at least one internally generated analog reference signal;
an analog-to-digital converter connected to said at least one input pad for providing a numerical value of the externally generated analog signal, and connected to said pre-sampling circuit for providing a numerical value of the internally generated analog reference signal; and
a fault signaling circuit connected to said pre-sampling circuit and to said analog-to-digital converter for generating a fault signal when the numerical value of the externally generated analog signal is equal to the numerical value of the internally generated analog reference signal.

10. An integrated circuit according to claim 9, wherein said analog-to-digital converter comprises a successive approximations analog-to-digital converter.

11. An integrated circuit according to claim 9, wherein said pre-sampling circuit comprises:
a biasing stage for providing the at least one internally generated analog reference signal; and
a pair of input path selection switches coupling the input of said analog-to-digital converter either to an output of said biasing stage during a pre-sampling phase of said analog-to-digital converter or to said at least one input pad during a successive operating phase of said analog-to-digital converter;
said fault signaling circuit comprising logic control circuitry for driving said pair of input path selection switches.

12. An integrated circuit according to claim 11, wherein said fault signaling circuit further comprises:
a register for storing the numerical value of the internally generated analog reference signal;
a comparator having a first input connected to said register for receiving the numerical value of the internally generated analog reference signal, and a second input connected to said analog-to-digital converter for receiving the numerical value of the externally generated analog signal; and
a pair of output path selection switches coupling an output of said analog-to-digital converter either to an input of said register during the pre-sampling phase of said analog-to-digital converter or to the second input of said comparator during the successive operating phase of the analog-to-digital converter;
said logic control circuitry for driving said pair of output path selection switches.

13. An integrated circuit according to claim 12, wherein an output of said comparator provides the fault signal.

14. An integrated circuit according to claim 12, wherein said logic control circuitry drives said pair of input path selection switches in an opposing phase, and drives said pair of output path selection switches in an opposing phase.

15. An integrated circuit according to claim 12, wherein said comparator defines a range of values between two thresholds for comparing with the numerical value of the externally generated analog signal.

16. An integrated circuit according to claim 12, wherein fault signaling circuit further comprises a counter coupled to an output of said comparator for providing the fault signal when said comparator verifies that the numerical value of the externally generated analog signal is equal to the numerical value of the internally generated analog reference signal for a certain number of successive samples of the externally generated analog input signal.

17. A method for indicating if an electrical connection providing an externally generated analog signal to at least one input of an integrated circuit is faulty, the method comprising:
providing the externally generated analog signal to the at least one input pad of the integrated circuit;
pre-sampling at least one internally generated analog reference signal;
providing a numerical value of the externally generated analog signal and a numerical value of the internally generated analog reference signal using an analog-to-digital converter; and
generating a fault signal when the numerical value of the externally generated analog signal is equal to the numerical value of the internally generated analog reference signal.

18. A method according to claim 17, wherein the analog-to-digital converter comprises a successive approximations analog-to-digital converter.

19. A method according to claim 17, wherein the pre-sampling is performed using a pre-sampling circuit comprising a biasing stage for providing the at least one internally generated analog reference signal; and a pair of input path selection switches coupling the input of the analog-to-digital converter either to an output of the biasing stage during a pre-sampling phase of the analog-to-digital converter or to the at least one input pad during a successive operating phase of the analog-to-digital converter; and wherein generating the fault signal is performed using logic control circuitry for driving the pair of input path selection switches.

20. A method according to claim 19, wherein the integrated circuit further comprises a register for storing the numerical value of the internally generated analog reference signal; and a comparator having a first input connected to the register for receiving the numerical value of the internally generated analog reference signal, and a second input connected to the analog-to-digital converter for receiving the numerical value of the externally generated analog signal; and a pair of output path selection switches coupling an output of the analog-to-digital converter either to an input of the register during the pre-sampling phase of the analog-to-digital converter or to the second input of the comparator during the successive operating phase of the analog-to-digital converter; and the logic control circuitry for driving the pair of output path selection switches.

21. A method according to claim 20, wherein an output of the comparator provides the fault signal.

22. A method according to claim 20, wherein the logic control circuitry drives the pair of input path selection switches in an opposing phase, and drives the pair of output path selection switches in an opposing phase.

23. A method according to claim 20, wherein the comparator defines a range of values between two thresholds for comparing with the numerical value of the externally generated analog signal.

24. A method according to claim 20, wherein the integrated circuit further comprises a counter coupled to an output of the comparator for providing the fault signal when the comparator verifies that the numerical value of the externally generated analog signal is equal to the numerical value of the internally generated analog reference signal for a certain number of successive samples of the externally generated analog input signal.

25. A method according to claim 17, wherein the electrical connection is an automobile so that the method is part of an auto-diagnostic test performed by the automobile.

* * * * *